(12) United States Patent
Tan et al.

(10) Patent No.: US 6,218,243 B1
(45) Date of Patent: Apr. 17, 2001

(54) METHOD OF FABRICATING A DRAM CAPACITOR

(75) Inventors: Wayne Tan, Taipei; Kun-Chi Lin; Gwo-Shii Yang, both of Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/252,127

(22) Filed: Feb. 18, 1999

(51) Int. Cl.[7] .................................................. H01L 21/8242
(52) U.S. Cl. ............................................. 438/255; 438/396
(58) Field of Search .................................. 438/255, 253, 438/254, 396, 397, 398, 399

(56) References Cited

U.S. PATENT DOCUMENTS 5,960,293 * 12/1999 Hong et al. ........................... 438/397
6,004,858 * 12/1999 Shim et al. ........................... 438/398

* cited by examiner

*Primary Examiner*—David Nelms
*Assistant Examiner*—Quoc Hoang
(74) *Attorney, Agent, or Firm*—Oppenheimer Wolff & Donnelly, LLP

(57) ABSTRACT

A method of fabricating a DRAM capacitor includes the step of forming an insulated layer and an etching stop layer successively on a substrate having a device structure. A contact window is formed within the etching stop layer and the insulated layer. A conductive layer is formed on the etching layer to fill in the contact window and patterned to serve as a lower electrode of the capacitor. A highly doped dielectric layer is then formed on the lower electrode and a thermal process is performed to diffuse the dopants inside the highly doped dielectric layer into the surface of the lower electrode. The dielectric layer is removed. A capacitor dielectric layer and an upper electrode are successively formed on the lower electrode to complete the fabrication of the capacitor.

16 Claims, 2 Drawing Sheets ance with the purpose of the invention, as embodied and
METHOD OF FABRICATING A DRAM CAPACITOR

BACKGROUND OF THE INVENTION

1. Field of the Invention

The invention relates to a method of fabricating a capacitor, and more particularly to a method of fabricating a 3-D capacitor of dynamic random access memory (DRAM).

2. Description of the Related Art

The lower electrode and the upper electrode of DRAM capacitor normally use polysilicon to serve as conductive material. However, the $V_{bias}$ applied on the upper electrode easily causes holes to form between the lower electrode and the capacitor dielectric layer. The holes compensate N-type impurities originally doped inside the polysilicon layer serving as a lower electrode. Consequently, a depletion region is formed on the upper surface of the lower electrode, thus forming an additional dielectric layer. In other words, the thickness of the overall dielectric layer is thickened, the surface of the capacitor dielectric layer is decreased and the charge storage capacity of the capacitor is reduced.

The depletion effect can be reduced by increasing the surface doping concentration of the lower electrode. In the traditional method, an ion implantation step is performed on the lower electrode, thereby implanting ions into the lower electrode to increase the surface doping concentration of the lower electrode. However, it is difficult for this method to solve the depletion problem occurring on the sidewall of the capacitor if a high, 3-D, stacked capacitor or a selective Hemisphere Grain (HSG) is used. This is because the implanted ions can barely reach the sidewall of the capacitor under the limitations of the implant angle and the shadowing effect. Therefore, the ion implantation to increase the surface doping concentration cannot thoroughly solve the depletion problem. In addition, the doping concentration on the lower electrode is not uniform, which leads to an unstable charge storage capacity of the capacitor. As a result, the reliability of the capacitor is reduced.

SUMMARY OF THE INVENTION

It is therefore an object of the invention to provide an improved method of fabricating a DRAM capacitor, thereby solving the depletion problem.

To achieve these objects and advantages, and in accordance with the purpose of the invention, as embodied and broadly described herein, the invention is directed towards an improved method of fabricating a DRAM capacitor. An insulated layer, an etching stop layer and an oxide layer are successively formed on a substrate at least having word lines formed thereon. A contact window is then formed within the oxide layer, the etching stop layer and the insulated layer by definition. A patterned amorphous Si is formed on the amorphous Si and fills the contact window. A selective HSG is then formed on the patterned amorphous Si, and the patterned amorphous Si and the selective HSG serve as a lower electrode of the capacitor. A highly doped dielectric layer is formed over the substrate and an annealing process is performed to diffuse the impurities inside the highly doped dielectric layer into the lower electrode. Therefore, the impurities uniformly distribute into the surface of the lower electrode and the depletion problem can be overcome. The dielectric layer and the oxide layer are then removed. Thereafter, a capacitor dielectric layer and a conductive layer serving as an upper electrode of the capacitor are successively formed on the lower electrode.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

To avoid the depletion effect leading to a reduction of the charge storage capacity of the capacitor, a highly doped dielectric layer is conformally formed on the lower electrode. The highly doped dielectric layer is used as a solid doping source. A thermal process is then performed and the dopants inside the dielectric layer diffuse into the surface of the lower electrode. Accordingly, the lower electrode of the capacitor has a higher and more uniform surface doping concentration to overcome the depletion problem, thereby raising the storage capacity of the capacitor.

FIGS. 1A–1E illustrate a schematic, cross-sectional view of a fabrication process for a DRAM capacitor. An amorphous Si and a selective HSG are used as an example in this invention, but the material and the structure of the lower electrode are not limited by this embodiment.

Figure 1A:
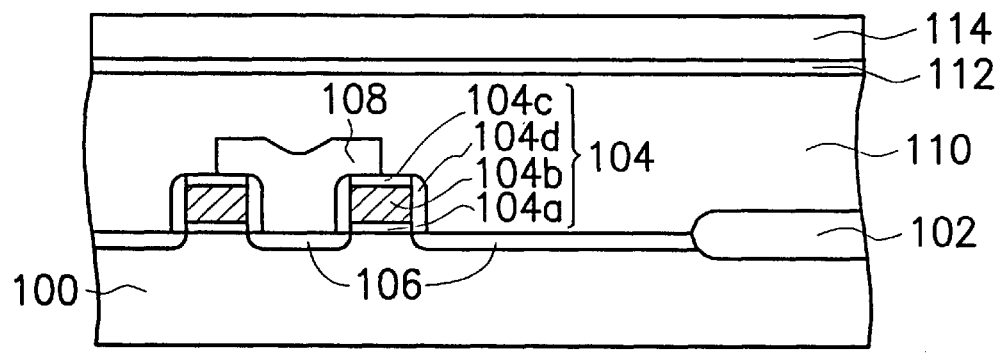
FIGS. 1A–1E are schematic, cross-sectional views illustrating of fabrication of a DRAM capacitor in a preferred embodiment according to the invention.

Referring to FIG. 1A, an isolation structure 102 is formed on a substrate 100 to define an active area. A gate 104 including a gate oxide layer 104a, a conductive layer 104b, a cap layer 104c and a spacer 104d is then formed on the substrate 100 to serve as a word line of the DRAM. A source/drain region 106 is formed in the substrate 100 beside the gate 104. A conductive layer is formed and patterned by photolithography to form a bit line 108 and electrically contact with the source/drain region 106. An insulated layer 110 is formed to cover the gate 104 and the bit line 108. The insulated layer 110, such as oxide layer is deposited by chemical vapor deposition (CVD). The insulated layer 110 has a planarized surface, which allows the subsequent process to be smoothly performed.

Referring to FIG. 1A again, an etching stop layer 112 is formed on the insulated layer 110. The insulated layer 110 can be a silicon nitride with a thickness of about 200 angstroms and is formed by CVD, for example. An oxide layer 114 is then formed on the etching stop layer 112. The oxide layer 114 can be a TEOS oxide and formed by LPCVD. The formation of the oxide layer 114 causes the selective HSG in subsequent process to be easily formed.

Figure 1B:
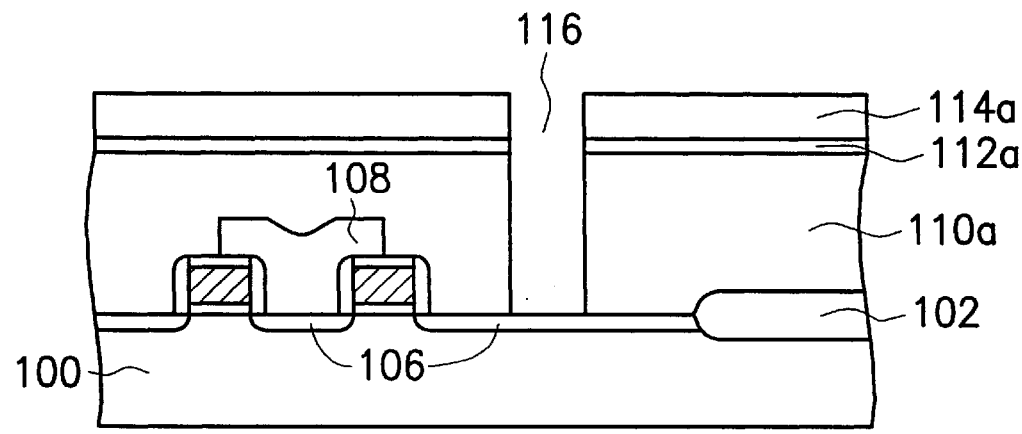

The oxide layer 114, the etching stop layer 112 and the insulated layer 110 are patterned and then etched by plasma, for example, to form a contact window 116 within the oxide layer 114a, the etching stop layer 112a and the insulated layer 110a, as shown in FIG. 1B. The source/drain region 106 is therefore exposed.

Figure 1C:
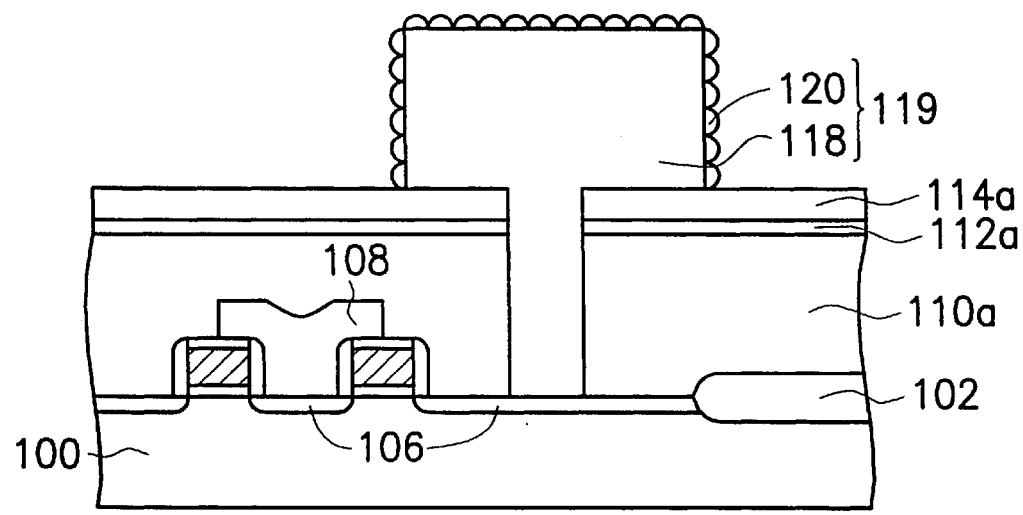

Referring to FIG. 1C, a conductive layer 118 such as an amorphous Si is formed on the oxide layer 114a and then patterned to form a capacitor region. A selective HSG 120 is deposited on the conductive layer 118. The amorphous Si can be formed by LPCVD in the presence of silane (SiH4) or SiH$_2$Cl$_2$ condition at a temperature of about 500–550° C., for example. When the amorphous Si is chosen to serve a material of the conductive layer 118, the selective HSG is selectively deposited on the amorphous Si 118. Since the oxide layer 114a is TEOS oxide, the deposition rate of the selective HSG is faster and the deposited grains have better quality. The conductive layer 118 and the selective HSG 120 serve as a lower electrode 119 of the capacitor.

Figure 1D:
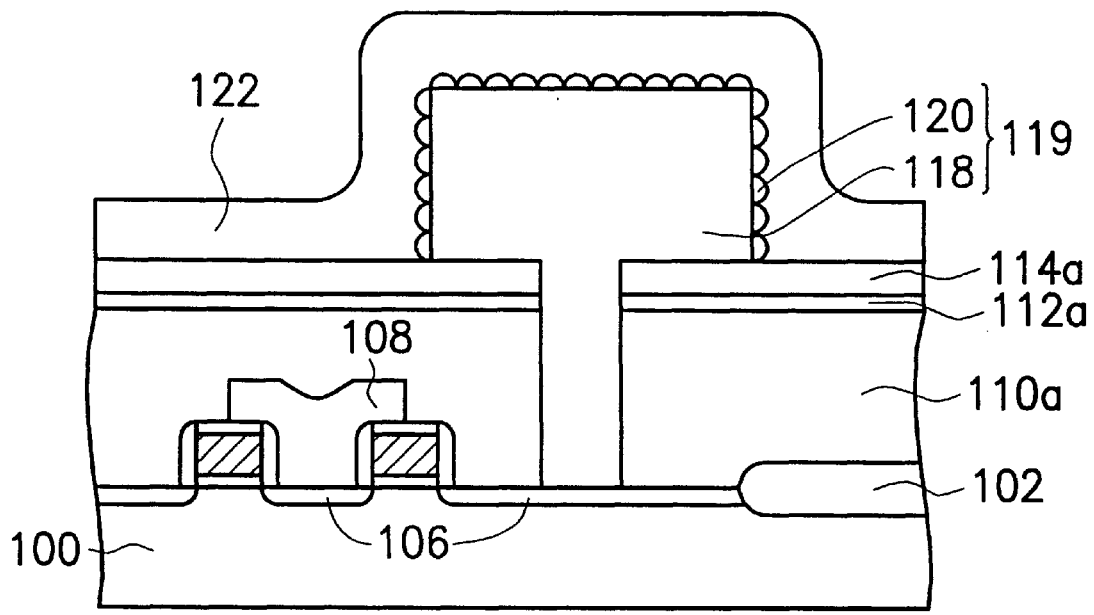
Figure 1E:
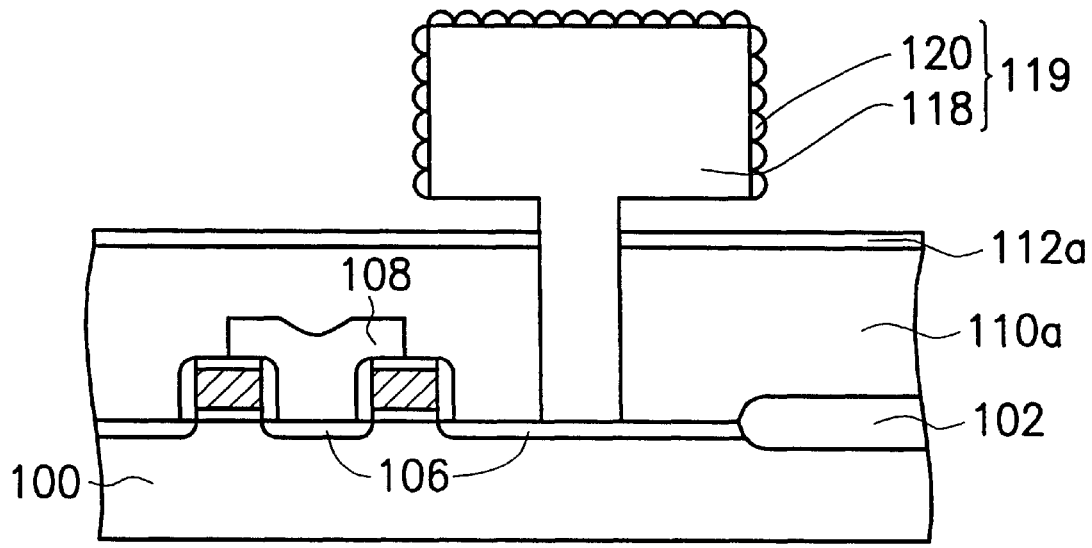

Referring to FIG. 1D, a highly doped dielectric layer 122 is conformally formed on the selective HSG 120 and the oxide layer 114a. The dopants inside the highly doped dielectric layer 122 can be N-type dopants and the dielectric layer, for example, is a phosphosilicate glass (PSG) or a silicate glass containing arsenic (As). The PSG is deposited by APCVD or SAPCVD at a temperature of about 600–800° C., corresponding to a reactant of tetra-ethyl-ortho-silicate (TEOS) and phosphine (PH$_3$).

A thermal process is performed on the substrate 100 at a temperature of about 800–900° C. The thermal process, such as annealing, causes the dopants inside the dielectric layer 122 to diffuse into the selective HSG 120 and amorphous Si 118, and the lower electrode 119 has N-type dopants on its surface. Since the selective HSG 120 and amorphous Si 118 are completely covered with the dielectric layer 122, the impurities can globally diffuse into the lower electrode 119 during the thermal process. Therefore, the sidewall of the lower electrode 119 is doped without the limitations of an ion implantation angle and a shadowing effect. In addition, the lower electrode 119 is uniformly doped by the thermal diffusion and the doping concentration is raised. As a result, the depletion region is enhanced and the storage capacity is therefore increased.

Referring to 1E, the dielectric layer 122 and the oxide layer 114a are then removed by wet etching in a hydrogen fluoride (HF) solution. Due to the formation of the etching stop layer, the insulated layer 110 can be protected from being eroded by wet etching. Therefore, the lower electrode 119 of the capacitor is completed. A capacitor dielectric layer (not shown) such as ONO is formed on the lower electrode 119 and a conductive layer (not shown) serving as an upper electrode is then formed on the capacitor dielectric layer.

The amorphous Si layer 118 and selective HSG 120 are used as a material to fabricate the lower electrode in this invention, but this invention also can be applied on any capacitor structure no matter whether an amorphous Si or a polysilicon layer serves as the lower electrode. In the preferred embodiment, due to the formation of the oxide layer 114, the selective HSG 120 can be easily deposited. It is not necessary to form the oxide layer 114 when this invention is applied on a lower electrode made of polysilicon. The formation of the etching stop layer 112a is required whatever the material of the lower electrode is, because the etching stop layer 112 can protect the insulated layer 110 therebeneath from being damaged while removing the highly doped dielectric layer 122.

Therefore, when the polysilicon layer is used as a lower electrode, the fabricated method of the lower electrode includes successively forming an insulated layer and an etching stop layer on a substrate having device structure. The etching stop layer and the insulated layer are then patterned to form a contact window to expose a portion of the substrate. A conductive material, such as polysilicon layer, is formed on the etching stop layer to fill the contact window. The conductive material is then defined to serve as a lower electrode of the capacitor wherein the lower electrode may includes a selective HSG formed thereon. A dielectric layer with dopants, such as an N-type impurity, is conformally formed on the lower electrode. A thermal process is performed to diffuse the dopants inside the dielectric layer into the surface of the lower electrode. The dielectric layer is then removed by using the etching stop layer as a protective layer and consequently, a lower electrode with uniform dopants on its surface is completed. As a result, the depletion effect can be avoided.

This invention is characterized by the use of a highly doped dielectric layer, formed on a lower electrode, as a source from which dopants are uniformly distributed into the surface of the lower electrode by a thermal process. Accordingly, the depletion effect is overcome, the storage capacity of the capacitor is increased, and the reliability of the capacitor is also enhanced.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a lower electrode of a DRAM capacitor adapted for a substrate having device structure, comprising:

forming an insulated layer and an etching stop layer successively on the substrate;

forming a contact window within the insulated layer and the etching stop layer;

forming a patterned conductive layer serving as a lower electrode on the etching stop layer to fill in the contact window;

forming a dielectric layer with dopants on the lower electrode;

performing a thermal process to diffuse the dopants inside the dielectric layer into the lower electrode; and removing the dielectric layer.

2. The method according to claim 1, wherein the insulated layer includes an oxide layer.

3. The method according to claim 1, wherein the etching stop layer includes a silicon nitride layer.

4. The method according to claim 1, wherein the conductive layer includes a polysilicon layer.

5. The method according to claim 1, wherein the dopants include N-type impurities.

6. The method according to claim 1, wherein the dopant is selected from the group consisting of phosphorus and arsenic.

7. The method according to claim 1, wherein the thermal process includes annealing.

8. The method according to claim 1, wherein the conductive layer further includes a selective HSG.

9. The method according to claim 1, wherein the dielectric layer is removed by wet etching.

10. A method of fabricating a DRAM capacitor adapted for a substrate having device structure, comprising:

successively forming an insulated layer, an etching stop layer and an oxide layer on the substrate;

forming a contact window within the oxide layer, the insulated layer and the etching stop layer;

forming a patterned amorphous silicon layer serving as a lower electrode on the oxide layer to fill in the contact window;

forming a selective HSG only on the patterned amorphous silicon layer, wherein the amorphous silicon layer and the selective HSG serve as a lower electrode;

performing an annealing process to diffuse dopants inside the doped dielectric layer into the storage node;

removing the dielectric layer and the oxide layer;

forming a capacitor dielectric layer on the lower electrode;

forming a conductive layer on the capacitor dielectric layer to serve as an upper electrode.

11. The method according to claim 10, wherein the insulated layer includes an oxide layer.

12. The method according to claim 10, wherein the etching stop layer includes a silicon nitride layer.

13. The method according to claim 10, wherein the oxide layer includes a TEOS-oxide.

14. The method according to claim 10, wherein highly doped dielectric layer includes PSG.

15. The method according to claim 10, wherein the highly doped dielectric layer includes a dielectric layer containing arsenic.

16. The method according to claim 10, wherein the dielectric layer and the oxide layer are removed by wet etching.

* * * * *